(12) United States Patent
Haskins et al.

(10) Patent No.: US 8,815,402 B2
(45) Date of Patent: Aug. 26, 2014

(54) MIRROR HAVING REFLECTIVE COATINGS ON A FIRST SURFACE AND AN OPPOSITE SECOND SURFACE

(75) Inventors: David R. Haskins, Gibsonia, PA (US); Mehran Arbab, Pittsburgh, PA (US); Andrew V. Wagner, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 628 days.

(21) Appl. No.: 13/073,332

(22) Filed: Mar. 28, 2011

(65) Prior Publication Data

US 2011/0240009 A1 Oct. 6, 2011

Related U.S. Application Data

(60) Provisional application No. 61/319,601, filed on Mar. 31, 2010.

(51) Int. Cl.

| | |
|---|---|
| *F24J 2/10* | (2006.01) |
| *F24J 2/46* | (2006.01) |
| *G02B 5/08* | (2006.01) |
| *C03C 17/36* | (2006.01) |
| *G02B 19/00* | (2006.01) |
| *H01L 31/052* | (2014.01) |
| *C03C 17/23* | (2006.01) |
| *C03C 17/34* | (2006.01) |

(52) U.S. Cl.
CPC .............. *C03C 17/23* (2013.01); *Y02E 10/40* (2013.01); *C03C 17/36* (2013.01); *C03C 2217/212* (2013.01); *G02B 19/008* (2013.01); *Y02E 10/52* (2013.01); *H01L 31/0525* (2013.01); *F24J 2/1057* (2013.01); *C03C 17/3417* (2013.01); *G02B 19/0042* (2013.01); *G02B 19/0023* (2013.01); *C03C 2217/734* (2013.01); *C03C 2218/365* (2013.01); *C03C 17/3663* (2013.01)
USPC ............ 428/428; 428/432; 359/884; 126/684

(58) Field of Classification Search
USPC .......... 428/426, 428, 432, 688, 699, 701, 702
See application file for complete search history.

(56) References Cited

U.S. PATENT DOCUMENTS 3,881,905 A * 5/1975 Cramer et al. ................. 65/99.4
4,111,150 A   9/1978 Donley et al.

(Continued)

FOREIGN PATENT DOCUMENTS

| AU | 758267 | 5/2000 |
| EP | 0456488 A1 | 11/1991 |
| WO | 2010/001061 A2 | 1/2010 |

OTHER PUBLICATIONS

International Search Report and Written Opinion for International Application No. PCT/US2011/030243, dated Jun. 30, 2011.

*Primary Examiner* — John J Zimmerman
(74) *Attorney, Agent, or Firm* — Andrew C. Siminerio (57) ABSTRACT

A solar mirror includes an opaque reflective coating on a surface of a transparent substrate facing away from the sun and a transparent reflective coating on the opposite surface of the substrate. The transparent reflective coating increases the percent reflection of wavelengths in selected ranges, e.g. wavelengths in the infrared range to increase the total solar energy reflected by the solar mirror to increase the solar energy directed to a receiver that converts solar energy to electric and/or thermal energy.

19 Claims, 8 Drawing Sheets

(56) References Cited

U.S. PATENT DOCUMENTS

| | | | |
|---|---|---|---|
| 4,714,308 A * | 12/1987 | Sawamura et al. | 359/360 |
| 4,719,126 A | 1/1988 | Henery | |
| 4,792,536 A * | 12/1988 | Pecoraro et al. | 501/70 |
| 5,030,593 A * | 7/1991 | Heithoff | 501/72 |
| 5,030,594 A * | 7/1991 | Heithoff | 501/72 |
| 5,253,105 A * | 10/1993 | Paul et al. | 359/359 |
| 5,356,718 A | 10/1994 | Athey et al. | |
| 5,393,593 A * | 2/1995 | Gulotta et al. | 428/220 |
| 5,667,880 A * | 9/1997 | Okaniwa | 428/212 |
| 5,745,291 A * | 4/1998 | Jenkinson | 359/586 |
| 5,757,564 A * | 5/1998 | Cross et al. | 359/870 |
| 6,027,766 A * | 2/2000 | Greenberg et al. | 427/226 |
| 6,413,581 B1 * | 7/2002 | Greenberg et al. | 427/226 |
| 6,673,730 B1 * | 1/2004 | Shelestak | 501/71 |
| 7,049,022 B2 | 5/2006 | Ohtani et al. | |
| 7,323,249 B2 | 1/2008 | Athey et al. | |
| 7,892,661 B2 * | 2/2011 | Boire et al. | 428/699 |
| 2002/0028361 A1 * | 3/2002 | Boire et al. | 428/701 |
| 2002/0094928 A1 * | 7/2002 | Shelestak | 501/27 |
| 2003/0162033 A1 * | 8/2003 | Johnson et al. | 428/426 |
| 2003/0235695 A1 * | 12/2003 | Greenberg et al. | 428/432 |
| 2003/0235720 A1 * | 12/2003 | Athey et al. | 428/702 |
| 2005/0137084 A1 * | 6/2005 | Krisko et al. | 502/349 |
| 2006/0165963 A1 * | 7/2006 | Fleury et al. | 428/212 |
| 2007/0188871 A1 * | 8/2007 | Fleury et al. | 359/586 |
| 2007/0243993 A1 | 10/2007 | Heithoff et al. | |
| 2009/0233037 A1 * | 9/2009 | Medwick et al. | 428/68 |
| 2009/0233071 A1 * | 9/2009 | Medwick et al. | 428/216 |
| 2010/0124643 A1 * | 5/2010 | Lu et al. | 428/216 |
| 2010/0126218 A1 | 5/2010 | Shelestak et al. | |
| 2010/0242953 A1 * | 9/2010 | Bhandari et al. | 126/684 |
| 2011/0073182 A1 * | 3/2011 | Taylor et al. | 136/259 |
| 2011/0102926 A1 | 5/2011 | Abbott et al. | |
| 2011/0117300 A1 * | 5/2011 | Wagner | 428/34 |
| 2011/0203578 A1 * | 8/2011 | Thiel | 126/684 |

\* cited by examiner

FIG. 10

MIRROR HAVING REFLECTIVE COATINGS ON A FIRST SURFACE AND AN OPPOSITE SECOND SURFACE

This application claims the benefit of the filing date of Patent Application Ser. No. 61/319,601 filed Mar. 31, 2010, in the names of David R. Haskins and Mehran Arbab, and titled SOLAR MIRROR HAVING REFLECTIVE COATINGS ON A FIRST SURFACE AND AN OPPOSITE SECOND SURFACE, and the application in its entirety is hereby incorporated by reference.

BACKGROUND OF THE INVENTION

1. Field of the Invention

This invention relates to a mirror having reflective coatings on a first surface and an opposite second surface, and more particularly, to a solar mirror having an opaque reflecting coating on a second surface of a transparent substrate to reflect light passing through the substrate and a transparent reflecting coating on the opposite first surface of the transparent substrate to reflect wavelengths in selected ranges of the electromagnetic spectrum that are absorbable by the substrate.

2. Discussion of the Technical Challenge

At the present time, there is interest to increase the efficiency of solar collectors, e.g. and not limiting to the discussion, improve the efficiency of solar mirrors, e.g. flat solar reflecting mirrors and shaped solar reflecting mirrors, used to reflect the sun's rays to a converting device. The converting device is usually of the type known in the art to convert the sun's energy to another form of energy, e.g. electric energy and/or thermal energy. In general and not limiting to the discussion, the solar mirror can be a primary mirror or a secondary mirror. The term "primary mirror" as used herein is a mirror on which solar rays are first reflected, and the term "secondary mirror" as used herein is a mirror on which reflected solar rays are re-reflected, e.g. to another solar mirror, or to a receiving element or receiver. The reflected solar rays incident on the secondary mirror can be reflected from a primary mirror or from another secondary mirror. The receiving element, or receiver, can include, but is not limited to, photovoltaic devices or a tube containing a fluid.

In general but not limiting to the discussion, the primary mirror is a shaped mirror, e.g. a parabolic, or cylindrical, shaped mirror having an opaque solar reflective coating, e.g. a silver coating on the convex surface or second surface of a shaped transparent substrate. The secondary mirror can be a shaped mirror or a flat mirror having the opaque solar reflective coating on a surface of a shaped or flat transparent substrate. Usually, the secondary mirror is a flat mirror having the reflective coating on the back surface or the second surface of a flat or lens shaped transparent substrate. In practice, the solar rays are incident on the first surface or concave surface of the primary mirror. A portion of the sun's rays are reflected from the first surface of the shaped mirror toward the receiver, or a secondary mirror, and a portion of the sun's rays pass through the substrate and are reflected by the opaque reflective coating back through the transparent substrate toward the receiver or the secondary mirror. In the instance when the sun's rays are reflected toward a secondary mirror, the reflected sun's rays from the primary mirror are incident on the secondary mirror and reflected by the secondary mirror to the receiver, or toward another secondary mirror. A more detailed discussion of primary and secondary solar reflecting mirrors is presented in U.S. patent application Ser. No. 12/709,045 filed on Feb. 19, 2010 and titled SOLAR REFLECTING MIRROR HAVING A PROTECTIVE COATING AND METHOD OF MAKING SAME, which document in its entirety is hereby incorporated by reference.

The transparent substrate of the primary and the secondary mirrors is usually made of soda-lime-silica glass because of the high yield in shaping a flat piece of soda-lime-silica glass into a parabolic shaped substrate; the low cost of making soda-lime-silica glass, and the high yield and low cost of applying a solar reflective coating on a surface of a flat piece or shaped piece of soda-lime-silica glass. Although soda-lime-silica glass is an acceptable material for the substrates for the solar mirrors, there are limitations. More particularly, a commercial grade soda-lime-silica glass is made of batch materials that include ingredients that absorb selected wavelengths of the electromagnetic spectrum. For example and not limiting to the discussion, a commercial grade of batch materials to make soda-lime-silica glass usually has at least 0.04 weight percent of iron oxides, namely ferric oxide ($Fe_2O_3$) and ferrous oxide (FeO). The ferric oxide has its absorption in the wavelength range of 300 to 400 nanometers ("nm") of the electromagnetic spectrum, and the ferrous oxide has its absorption in the wavelength range of 780-1550 nm of the electromagnetic spectrum and its peak absorption in the wavelength range 1000-1200 nm of the electromagnetic spectrum. The absorption by the ferric oxide in the 300-400 nm range, and by the ferrous oxide in the 780-1550 nm range, of the electromagnetic spectrum reduces the amount of solar energy incident on the converting device.

As is appreciated by those skilled in the art, a purer grade of soda-lime-silica glass batch materials having reduced weight percents of iron oxides are available. For example, soda-lime-silica glasses having less than 0.04 weight percent of iron oxides are disclosed in U.S. patent application Ser. No. 12/275,264 filed Nov. 21, 2008 and U.S. Pat. No. 5,030,594, which documents in their entirety are incorporated herein by reference. PPG Industries, Inc. sells such glasses under the trademarks STARPHIRE and SOLARPHIRE PV.

Unfortunately, the cost of batch materials for making soda-lime-silica glasses having less than 0.04 weight percent of iron oxides is two to three times more expensive than the cost of the batch materials for making soda-lime-silica glasses having more than 0.04 weight percent of iron oxides. As can now be appreciated, it would be advantageous to provide a solar reflecting mirror having a soda-lime-silica glass substrate having greater than 0.04 weight percent of iron oxides and having reduced absorption of wavelengths in selected ranges of the electromagnetic spectrum, e.g. in the wavelength ranges of 300-400 nm, and 780-1550 nm, of the electromagnetic spectrum.

SUMMARY OF THE INVENTION

This invention relates to an improved solar reflecting mirror of the type having a transparent substrate having a first surface designated to face a source of solar energy and a second surface opposite to the first surface, the second surface designated to face away from the source of solar energy. The glass substrate has a composition including, among other things, an ingredient that absorbs one or more wavelengths of the electromagnetic spectrum defined as absorbable wavelengths, and an opaque solar reflecting coating on the second surface of the glass substrate. The improvement of the invention includes, among other things, a transparent reflecting coating over the first surface of the substrate to increase the percent reflection of one or more of the absorbable wavelengths of the electromagnetic spectrum in a direction away from the first and the second surface of the transparent substrate.

This invention further relates to a solar reflecting mirror having, among other things, a substrate, especially a glass substrate, having a second surface designated to face away from the source of solar energy and a first surface opposite to the second surface, i.e. the first surface facing the sun, wherein the glass substrate has a composition including, but not limited to, an ingredient that absorbs one or more wavelengths of the electromagnetic spectrum defined as an absorbable wavelengths; an opaque solar reflecting coating applied to the second surface of the glass substrate, and a transparent reflecting film applied to the first surface of the glass substrate to reflect one or more of the absorbable wavelengths of the electromagnetic spectrum.

DETAILED DISCUSSION OF THE INVENTION

In the following discussion, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about." Accordingly, unless indicated to the contrary, the numerical values set forth in the following specification and claims can vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1 to 6.7, or 3.2 to 8.1, or 5.5 to 10. Also, as used herein, the terms "applied over", or "provided over" mean applied, or provided on but not necessarily in surface contact with. For example, a material "applied over" a substrate or a substrate surface does not preclude the presence of one or more other materials of the same or different composition located between the deposited material and the substrate or substrate surface.

Before discussing non-limiting embodiments of the invention, it is understood that the invention is not limited in its application to the details of the particular non-limiting embodiments shown and discussed herein since the invention is capable of other embodiments. More particularly, in the following discussion, the invention is practiced on solar mirrors, the invention, however, is not limited thereto, and can be practiced on any type of mirror. Further, the terminology used herein to discuss the invention is for the purpose of description and is not of limitation. Still further, unless indicated otherwise, in the following discussion like numbers refer to like elements.

In the following discussion, the solar rays initially impinge on, and are reflected from a shaped, e.g. a cylindrical, spherical or parabolic shaped, reflecting mirror, however, the invention is not limited thereto, and the invention, unless indicated other wise can be practiced with any mirror having a curved reflective surface and a focal point or focal area, or with a flat surfaced mirror. A "focal point" and "focal area" is defined as a position where more than 80% of the solar rays reflected from the shaped mirror converge. The size of the "focal area" is less than one fifth of the reflective area of the mirror.

Figure 1:
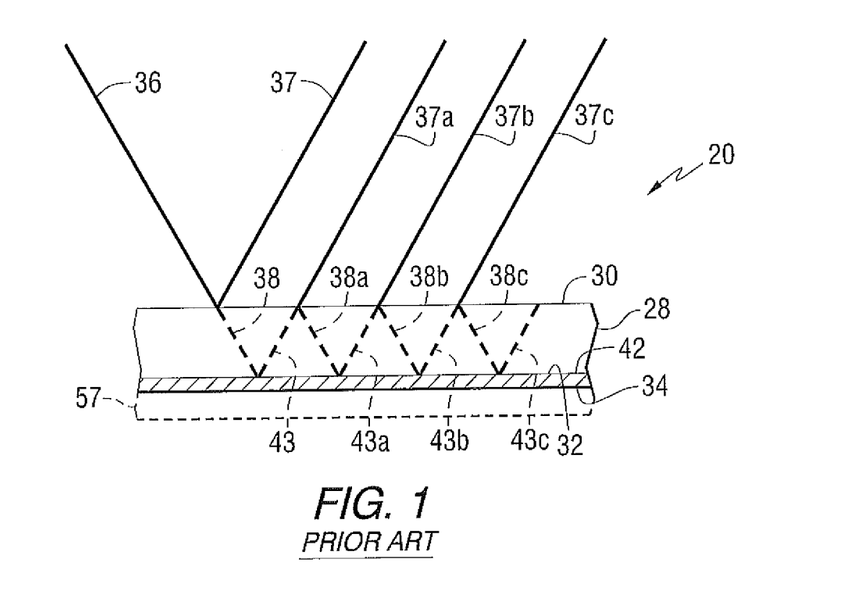
FIG. 1 is a cross sectional view of a prior art solar mirror showing the reflection and re-reflection of a sun's ray incident on the surface, e.g. the first surface, of the solar mirror. The cross hatching of the reflective coating is shown, and the cross hatching of the transparent substrate is not shown, for purposes of clarity.

With reference to FIG. 1 there is shown a cross sectional view of a solar mirror 20 having a transparent substrate 28, e.g. but not limiting to the invention a soda-lime-silica glass having a first surface 30 facing the sun (not shown), and an opposite surface or second surface 32. In the instance when the solar mirror 20 is a shaped mirror, e.g. but not limiting to the discussion, a parabolic shaped solar mirror (see FIG. 2), the first surface 30 (FIG. 1) is the concave surface, and the second surface 32 is the convex surface, and in the instance when the solar mirror is a flat mirror (see FIG. 3) the surfaces 30 and 32 (FIG. 1) are usually parallel to one another and both of the surfaces 30 and 32 are flat. A reflective coating, layer or film 34 is applied to the second surface 32 of the substrate 28 to reflect the sun's rays in the manner discussed below. The opaque solar reflective film 34 can be metal, e.g. but not limited to, silver, aluminum, nickel, stainless steel or gold. Usually the reflective film 34 is silver.

As can be appreciated, the invention is not limited to the material of the transparent substrate 28, and the substrate 28 can be any type of transparent material, e.g. but not limited to glass and plastic.

Figure 2:
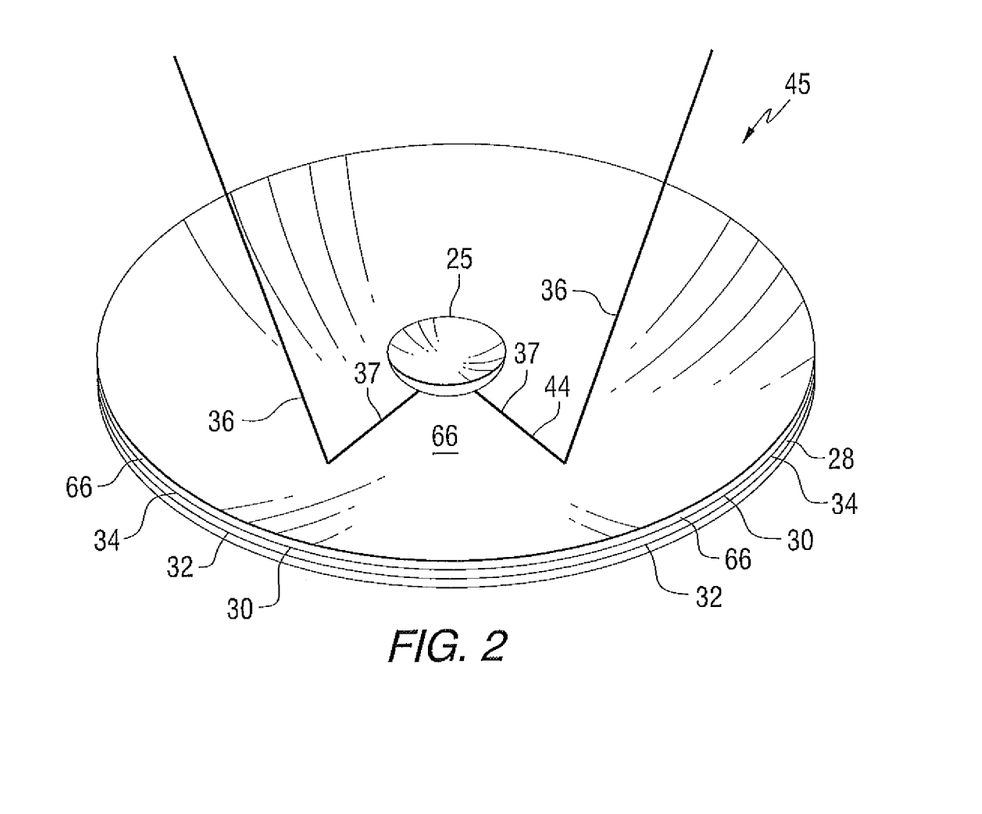
FIG. 2 is an elevated plan view of a shaped solar mirror of the invention.
Figure 3:
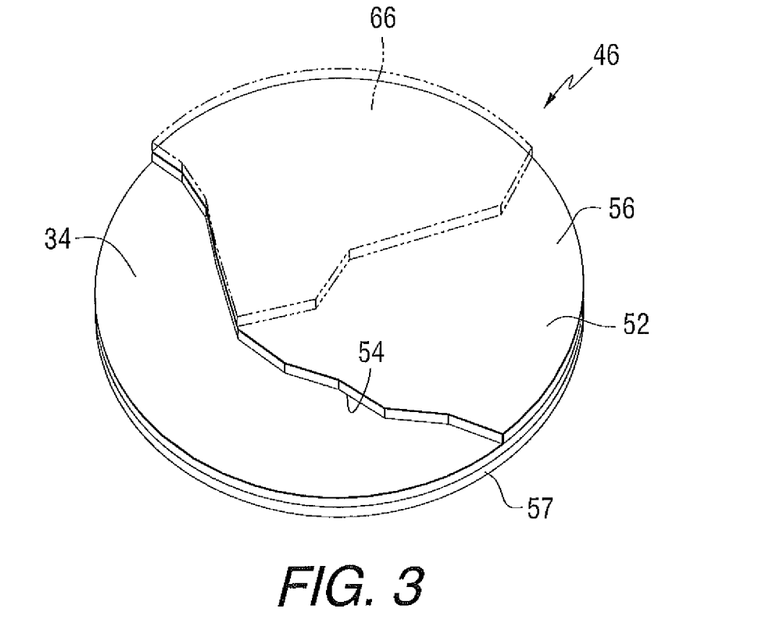
FIG. 3 is an isometric view of a flat secondary mirror of the invention having portions of the transparent reflective coating of the invention removed for purposes of clarity.

In the following discussion reference is made to a shaped solar mirror (FIG. 2), and the discussion, unless indicated otherwise, is applicable to a flat solar mirror (FIG. 3). With continued reference to FIG. 1, the parallel solar energy rays represented by ray 36 in FIG. 1 is incident on the first or concave surface 30 of the shaped glass substrate 28. The solar energy rays are shown in FIG. 1 as one ray 36 for purpose of clarity and simplicity instead of the infinite number of parallel solar energy rays incident on the concave surface 30. A portion 37 of the ray 36 is reflected from the concave surface 30 of the mirror 20 to a receiver (receiver 25 only shown in FIG. 2) or to a secondary mirror (flat mirror 46 shown in FIG. 3). With continued reference to FIG. 1, a portion 38 of the ray 36 passes through the surface 30 of the substrate 28, through the transparent substrate 28, and is reflected from surface 42 of the reflective film 34 as reflected ray 43 back through the glass substrate 28. A portion of the reflected ray 43 passes through the surface 30 of the substrate 28 as ray 37a toward the receiver 25, and a portion 38a of the ray 43 is reflected from the first surface 30 through the glass substrate 28 to the second surface 32. The ray 38a is reflected from the surface 42 of the reflective film 34 as reflective ray 43a. A portion of the ray 43a passes through the first surface 30 as ray 37b toward the secondary mirror 25, and a portion 38b of the ray 43a is reflected from the first surface 30 through the glass substrate 28 to the second surface 32. The ray 38b is reflected from the surface 42 of the reflective film 34 as reflective ray 43b. A portion of the ray 43b passes through the first surface 30 as ray 37c toward the receiver 25, and a portion 38c of the ray 43b is reflected from the first surface 30 through the transparent substrate 28 to the second surface 32. The ray 38c is reflected from the surface 42 of the reflective film 34 as reflective ray 43c to repeat the reflection of the rays as discussed above. As is appreciated by those skilled in the art, a portion of the rays 38, 38a, 38b and 38c at the convex surface 32 is reflected back through the transparent substrate 28, and a portion of the rays 38, 38a, 38b and 38c passes through the second surface 32 (these multiple reflected rays are not shown in FIG. 1 for purposes of clarity).

In the embodiment of the invention shown in FIG. 2, the rays 37, 37a, 37b and 37c shown in FIG. 1 are collective shown in FIG. 2 as ray 37. With reference to FIG. 2, the reflected rays 37 are incident on the receiver 25 positioned at the focal point or focal area of the shaped solar mirror 45. The invention, however, is not limited thereto, and the invention contemplates directing the rays 37 to a secondary mirror, e.g. the secondary mirror 46 shown in FIG. 3, positioned at the focal point or focal area of the shaped mirror 45. In this instance, the rays 37 are incident on the secondary mirror 46 and are reflected from the secondary mirror 46 to a receiver, e.g. as disclosed in U.S. patent application Ser. No. 12/709, 045 filed on Feb. 19, 2010.

As can be appreciated, the invention is not limited to the receiver 25, and the receiver 25 can be any of the types used in the art to receive solar energy and convert the solar energy to electric energy or thermal energy. In one non-limiting embodiment of the invention the solar mirrors reflect solar energy in concentrated solar power (CSP) or concentrated photovoltaic (CPV) applications.

With reference to FIG. 3, in a non-limiting embodiment of the invention, the secondary mirror 46 includes a flat transparent substrate 52, e.g. a sheet of soda-lime-silicate glass or a sheet of transparent plastic having the opaque solar reflective coating 34 applied over major surface 54 of the transparent substrate 52. The reflected solar rays 37 (see FIG. 2) from the primary mirror 45 impinge on major surface 56 of the transparent substrate 52, pass through the substrate 52 and are reflected by the opaque solar reflective coating 34 back through the transparent substrate 52 as the secondary rays 44 directed toward the receiver 25 as disclosed in U.S. patent application Ser. No. 12/709,045 filed on Feb. 19, 2010.

The discussion above regarding internally reflected solar rays 38 and 43 as the ray 36 is incident on, and passes, through the shaped transparent substrate 28 is applicable to the solar ray 37 incident on and passing through the major surface 56 of the transparent substrate 52 of the secondary mirror 46.

Optionally, a protective plastic coating or film 57 can be provided over the reflective coating 34. As is known in the art, the protective coating 57 protects the reflective coating 34 against damage from the environment, e.g. against scratches and chemical attack.

It can now be appreciated that the sun's rays 36 absorbed by the glass substrate 28 of the primary mirror 45 (FIG. 2) and the glass substrate 52 of the secondary mirror 46 (FIG. 3) reduces the solar energy incident on the receiver 25. In the practice of the invention, the loss of solar energy by absorption is reduced at selected wavelengths by 20-35%, preferably 35-40% and more preferably by 40-45% by increasing the reflection of selected ones of absorbable wavelengths of the electromagnetic spectrum away from the glass substrates 28 and 52. In this manner, the percent absorption of the selected ones of the absorbable wavelengths of the electromagnetic spectrum passing into the glass substrates 28 and 52 is reduced.

Figure 4:
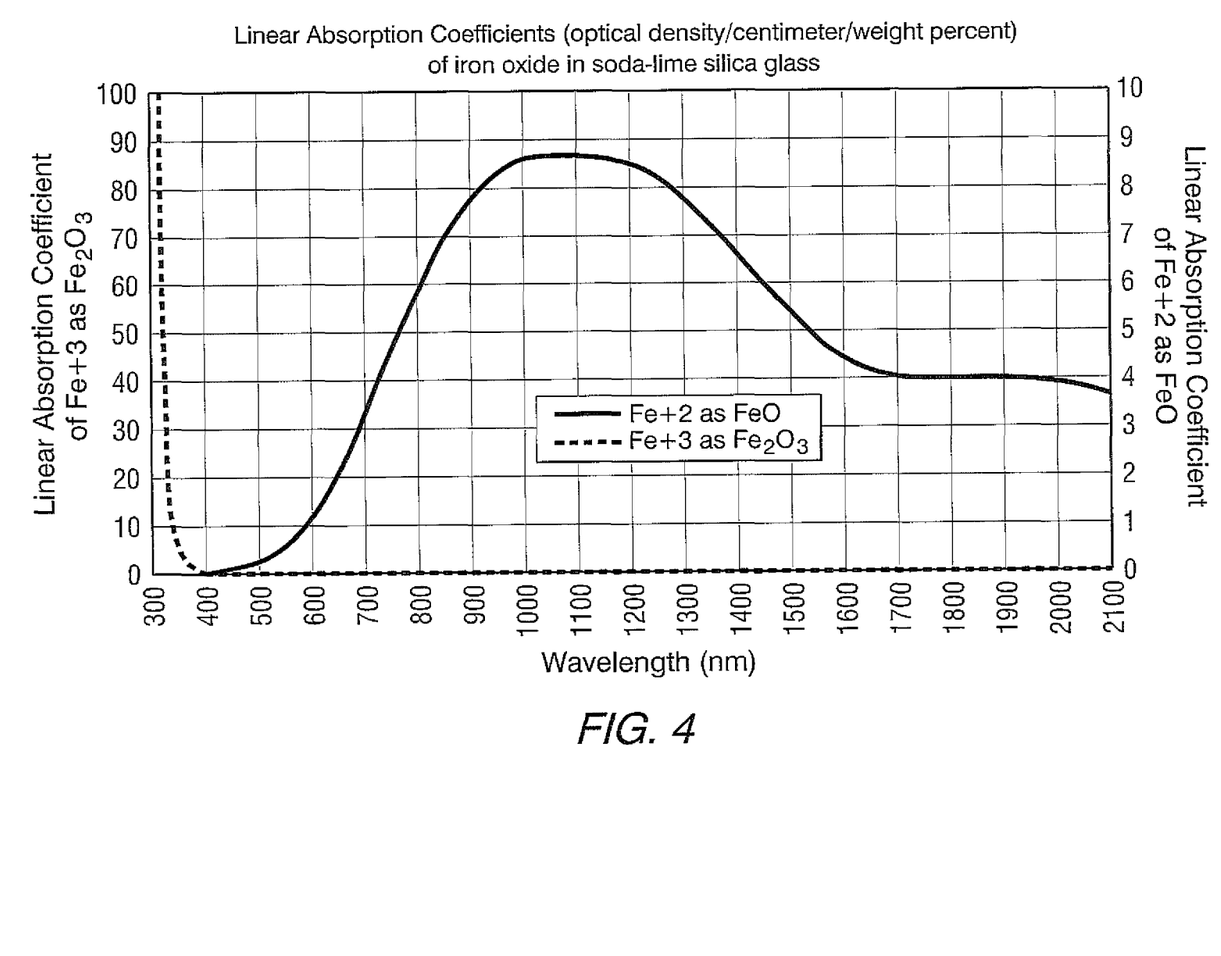
FIG. 4 is a graph showing the linear absorption coefficients (optical density/centimeter/weight percent) of iron oxide in soda-lime-silica glass. The linear absorption coefficients for ferric oxide ($Fe_2O_3$) are shown on the left side of the graph and are in the range of 0-100, and the linear absorption coefficients for ferrous oxide (FeO) are shown on the right side of the graph and are in the range of 0-10.

One non-limiting embodiment of the invention is practiced to reduce the percent absorption of the solar energy by the iron oxides, namely ferric oxide ($Fe_2O_3$) and ferrous oxide (FeO), in soda-lime-silica glass. The ferric oxide has its peak absorption in the wavelength range of 300 to 400 nm, and the ferrous oxide has its peak absorption in the wavelength range of 780-1550 nm, of the electromagnetic spectrum (see FIG. 4). The graph of FIG. 4, clearly shows that the peak absorption of ferric oxide in the wavelength range of 300-400 nm is much greater than the peak absorption of ferrous oxide in the wavelength range of 780-1550 nm. For purposes of clarity in the discussion of the invention, the ultraviolet wavelength range of the electromagnetic spectrum is greater than 0 to 380 nanometers ("nm"), the visible light wavelength range of the electromagnetic spectrum is greater than 380 to 780 nm, and the infrared energy wavelength range of the electromagnetic spectrum is greater than 780 nm.

As can be appreciated, as the weight percent of the ferric oxide and the ferrous oxide increases, the percent absorption increases. The invention, however, is not limited to weight percent of ferric oxide and ferrous oxide present in the glass substrate, and the benefits of the invention are realized with the presence of ferric oxide and of ferrous oxide in weight percents greater than zero.

The following experiment was conducted to measure the improvement in reflected solar energy by the practice of the invention. A piece of glass of the type sold by PPG Industries Inc. under the trademark SOLARPHIRE PV had an opaque silver reflecting coating on a first major surface. The glass having the silver coating is hereinafter referred to as "Sample 1". The glass of Sample 1 had a weight percent of ferric oxide ($Fe_2O_3$) of 0.0047, and a weight percent of ferrous oxide (FeO) of 0.0033. A piece of soda-lime-silica glass (hereinafter referred to as "Sample 2") having a thickness of 0.125 inch (0.32 centimeter), and a weight percent of ferric oxide ($Fe_2O_3$) of 0.058, and a weight percent of ferrous oxide (FeO)

of 0.027 was positioned on the second major surface of Sample 1; the second major surface of Sample 1 was opposite to the silver coated first major surface of Sample 1. A liquid film of index matching oil having an index of refraction of 1.52 was provided between and in contact with the second major surface of Sample 1 and the surface of the Sample 2 to eliminate index of refraction changes as the rays of solar energy pass between the adjacent surfaces of Sample 1 and Sample 2. The reflected solar energy of laminated Sample 1 and Sample 2 (hereinafter also referred to as "Laminate 1") in the wavelength of 300 to 2500 nm of the electromagnetic spectrum was measured using a PerkinElmer Lambda 950 spectrophotometer. The reflected solar energy for Laminate 1 for the wavelength range of 300 to 2500 nanometers of the electromagnetic spectrum is shown in the graph of FIG. 5, and the reflected solar energy for Laminate 1 for the wavelength range of 300 to 400 nanometers of the electromagnetic spectrum is shown in the graph of FIG. 6.

Figure 7:
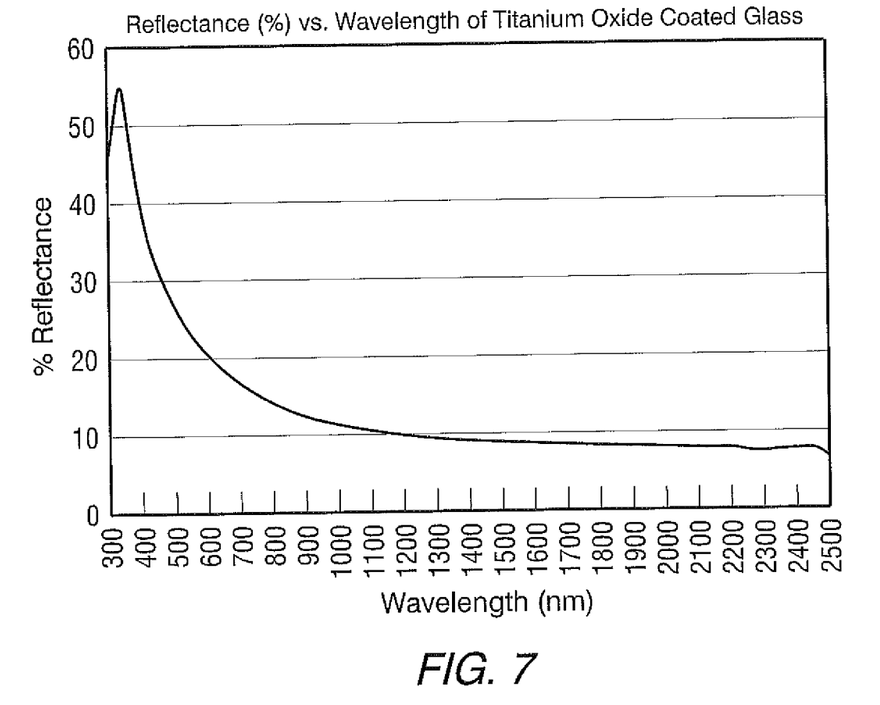
FIG. 7 is a graph showing reflectance of a titanium oxide coated glass in the wavelength range of 300-2500 nanometers of the electromagnetic spectrum.

Sample 1 and Sample 2 were separated. A piece of glass having a titanium oxide coating on a first major surface and an uncoated opposite second surface (hereinafter referred to as "Sample 3") was provided. The composition of the glass and the thickness of Sample 3 was the same as the composition of the glass and thickness of the glass of Sample 2. The titanium oxide coating of Sample 3 had a thickness of 25 to 30 nm, and the titanium oxide was applied by the chemical vapor deposition coating method and was of the type disclosed in U.S. Pat. No. 7,049,022, which patent in its entirety is incorporated herein by reference. The coated glass described above was selected as the transparent reflective coating for Sample 3 because it has a high reflectance in the wavelength range of 300-400 nanometers of the electromagnetic spectrum. More particularly, the graph of FIG. 7 shows Sample 3 having a reflectance peak of 55% at a wavelength of 350 nm of the electromagnetic spectrum, which is within the peak absorption range for the ferric oxide (see FIG. 4), and a reflectance in the range of 9.5-15% in the wavelength range of 780-1550 nm, which is the peak absorption range for the ferric oxide (see FIG. 4).

The uncoated second surface of Sample 3 was positioned on the uncoated second major surface of Sample 1. The film of index matching oil was provided between and in contact with the uncoated second surface of Sample 3 and uncoated second major surface of Sample 1. The reflected solar energy in the wavelength of 300 to 2500 nanometers of laminated Sample 1 and Sample 3 (hereinafter also referred to as "Laminate 2") was measured using the Perkin Elmer Lambda 950 spectrophotometer. The reflected solar energy for Laminate 2 is shown in the graphs of FIGS. 5 and 6.

Figure 5:
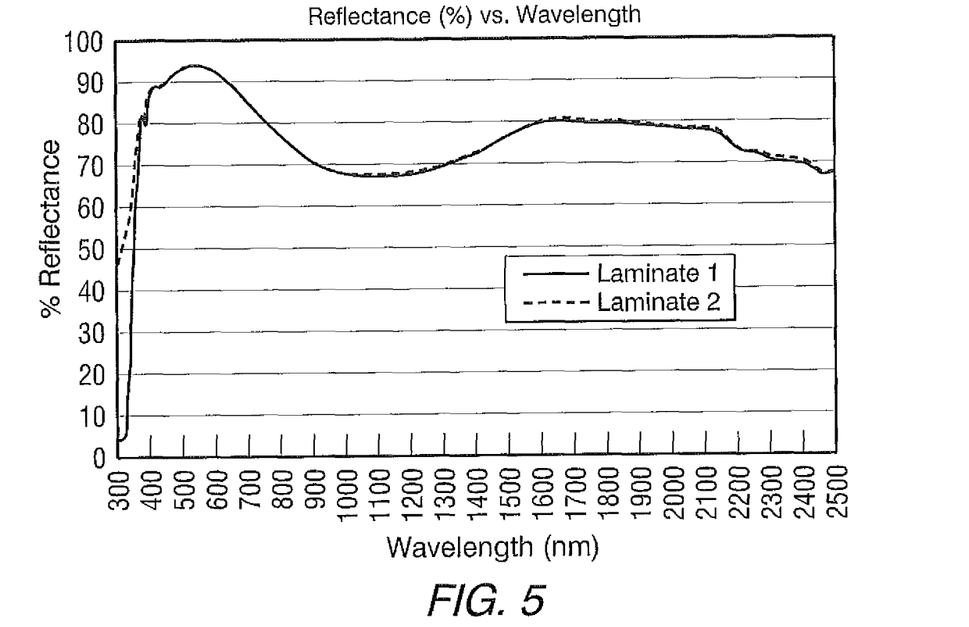
FIG. 5 is a graph showing reflectance of laminate 1 and laminate 2 in the wavelength range of 300-2500 nanometers of the electromagnetic spectrum. Laminate 2 is a non-limiting embodiment of the invention.
Figure 6:
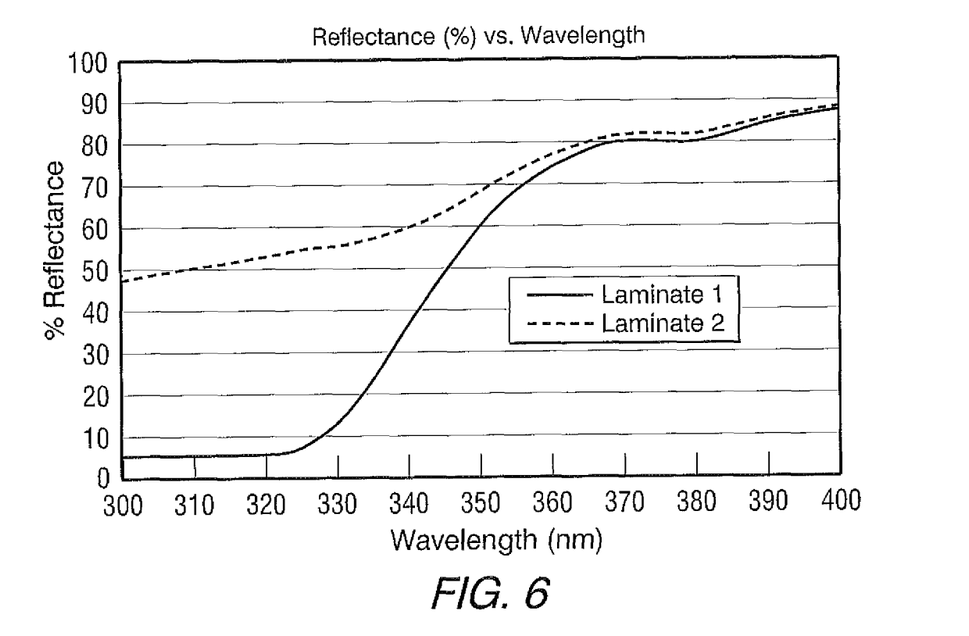
FIG. 6 is a graph similar to the graph of FIG. 6 showing reflectance of laminate 1 and laminate 2 in the wavelength range of 300-400 nanometers of the electromagnetic spectrum.

Graphs of FIGS. 5 and 6 show the reflectance vs. wavelength to be about the same in the wavelength range of 400 to 2500 nanometers, and a significant difference in the range of 300 to 400 nanometers. More particularly, Laminate 1 has a reflection of about 5% in the wavelength range of 300-325, and the Laminate 2 has a reflection in the range of 46-55% in the wavelength range of 300-325 nanometers. Table 1 below shows the percent reflectance for Laminate 1 and Laminate 2. The reflected solar energy was measured using the Perkin Elmer Lambda 950 spectrophotometer. The values are based on ISO 9050, 2003 methodology with wavelength ranges of 300 to 380 nm for the ultraviolet range ("UV"), greater than 380 to 780 nm for the visible range ("VIS"), greater than 780 to 2500 nm for the infrared range ("IR"), and 300 to 2500 nm for the total solar energy range ("TS") range of the electromagnetic spectrum.

TABLE 1

| | Reflectance in % | | | |
|---|---|---|---|---|
| | UV | VIS | IR | TS |
| Laminate 1 | 55.95 | 92.98 | 72.3 | 80.93 |
| Laminate 2 | 70.23 | 92.97 | 72.3 | 81.44 |

The change in reflectivity in the VIS and IR ranges were minor; however this is acceptable because the peak absorption of FeO is low in the VIS and IR ranges, e.g. a linear absorption coefficient of less than 9 in the wavelength range of greater than 380-1550 nm, and the titanium oxide at a thickness of 25-30 nm has a reflectance of less than 12% in the wavelength of 780-1550 nm. As can be appreciated from the data of the Table 1, the practice of the invention increased the TS reflectance by 0.6% and increased the UV reflectance by 25.5%.

Figure 8:
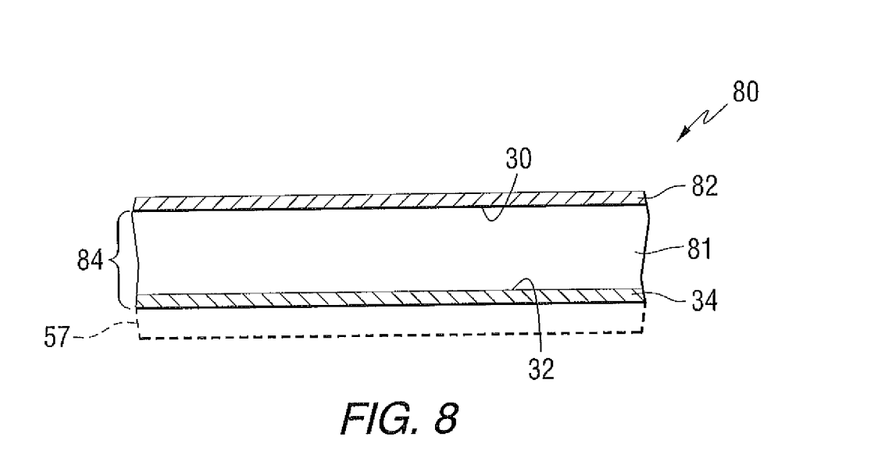
FIG. 8 is a view similar to the view of FIG. 1 showing the cross-section of a non-limiting embodiment of a solar mirror of the invention.

With reference to FIG. 8, there is shown a cross section of a solar mirror 80 incorporating features of the invention. The solar mirror 80 includes glass substrate 81 having the opaque reflective film 34 on the second surface 32 of the glass substrate 81 and reflective coating 82 of the invention on the first surface 30 of the glass substrate 81. The reflective coating 82 in this non-limiting embodiment of the invention is a titanium oxide coating 82 having a thickness of 90 nm. For purposes of discussion and not limiting to the invention, the glass substrate 81 having the opaque reflective coating 34 is referred to as subassembly 84.

Figure 9:
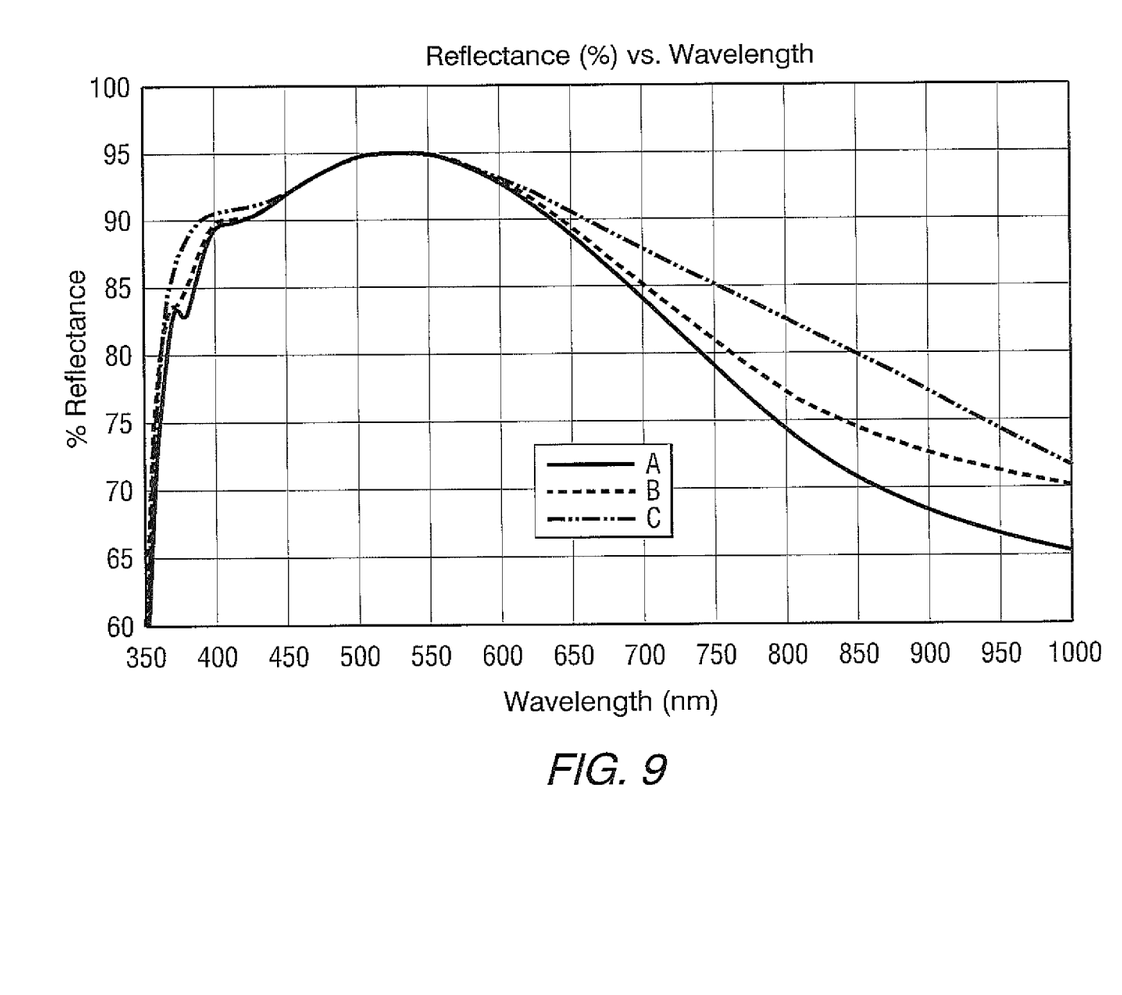
FIG. 9 is a graph showing reflectance vs. wavelength of an uncoated glass and coated glasses of the invention in the wavelength range of 350-1000 nanometers.
Figure 10:
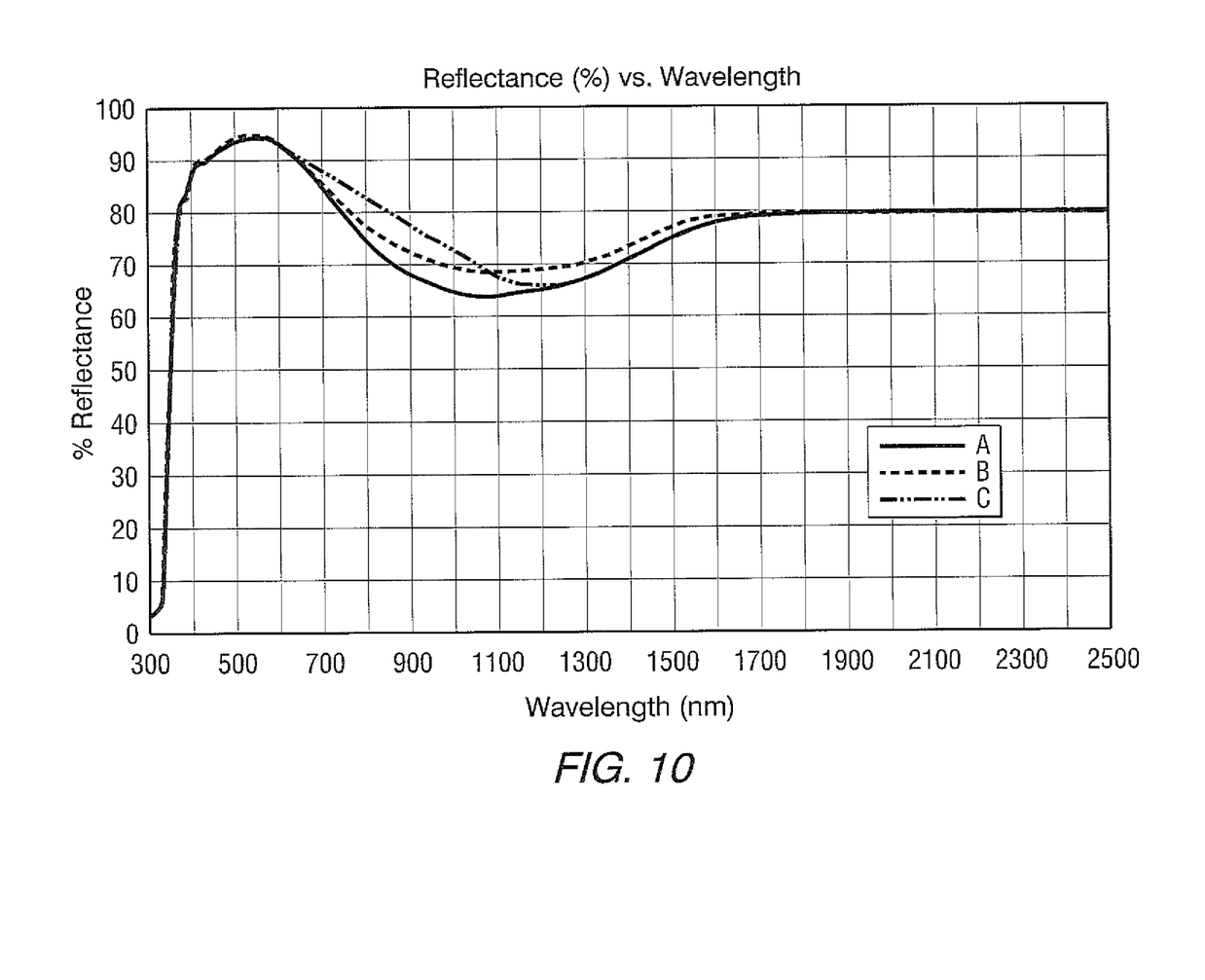
FIG. 10 is a graph showing reflectance vs. wavelength of the uncoated glass and coated glasses of the invention FIG. 9 in the wavelength range of 300-2500 nanometers.

With reference to FIGS. 9 and 10, the reflectance of the subassembly 84 (the glass substrate 82 without the coating 82 and with the opaque reflective film 34) is shown by Curve A, and the reflectance of the subassembly 84 having the coating 82 is shown by Curve B. The reflectance of Curve A and of Curve B over the wavelength range of 300-1610 nm was obtained using a proprietary software program developed by PPG Industries, Inc. using historical data from glass substrates and titanium oxide films deposited on glass substrates. The upper wavelength range limit of 1610 nm was selected as a cutoff because the peak absorption for the ferric iron is in the wavelength range of 300-400 nm; the peak absorption for the ferrous iron is in the wavelength range of 780-1550 nm, and the historical values beyond wavelengths of 1610 nm were considered too random. The reflectance for the wavelengths in the range of 1610-2500 shown in FIG. 10 is a linear extension of the reflectance at the wavelength of 1610 where the calculated reflectivity values for the Curve A and for Curve B converge.

Table 2 below shows the percent reflectance for the subassembly 84 and the subassembly 84 having the titanium oxide coating 82. The values are based on ISO 9050 (2003) methodology with wavelength ranges of 300 to 380 nm for the ultraviolet range ("UV") greater than 380 to 780 nm for the visible range ("VIS"), greater than 780 to 2500 nm for the infrared range ("IR"), and 300 to 2500 nm for the total solar energy range ("TS"). The reflected UV, VIS, IR and TS were calculated using ISO 9050 (2003) methodology.

TABLE 2

| | Reflectance in % | | | |
|---|---|---|---|---|
| | UV | VIS | IR | TS |
| Subassembly 84 | 59.26 | 93.84 | 70.51 | 80.60 |
| Subassembly 84 with coating 82 | 60.78 | 93.92 | 73.82 | 82.31 |

With reference to Table 2, the reflectance change in the UV is an increase of 2.5%; in the VIS is an increase of less than 0.01%; in the IR is an increase of 4.6%, and in the TS is an increase of 2.1%. With reference to Tables 1 and 2, increasing the thickness of the titanium oxide film reduced the percent increase in reflectance in the UV and increased the percent reflectance in the TS.

As can be appreciated, the invention is not limited to the thickness of the titanium oxide coatings 66 and 82, and the thickness of the titanium oxide coating should be selected to maximize the total solar energy reflected by the solar mirror. Although not limiting to the invention, the invention contemplates having the titanium oxide coating in the thickness range 25-125 nm, preferably in the thickness range of 30-100 nm and most preferably in the thickness range of 35-95 nm.

Figure 11:
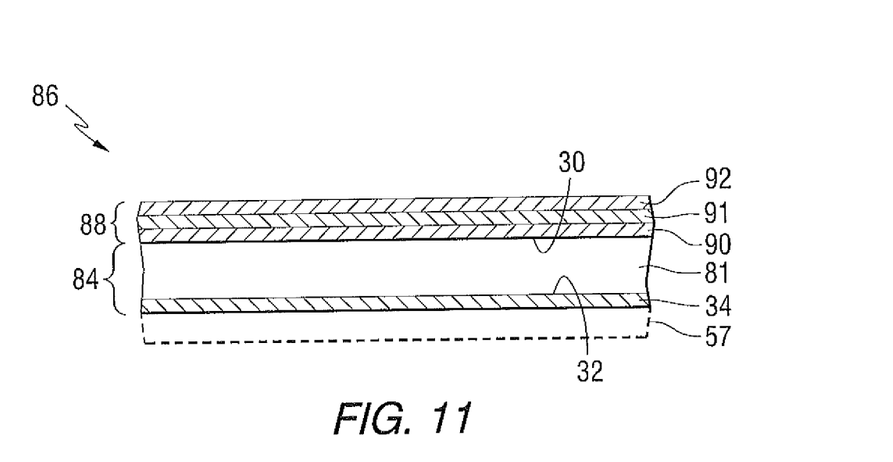
FIG. 11 is a view similar to the view of FIG. 8 showing the cross-section of another non-limiting embodiment of a solar mirror of the invention.

In another non-limiting embodiment of the invention, a solar collector 86 coated in accordance to the teachings of the invention is shown in cross section in FIG. 11. The solar collector 86 includes the glass substrate 81 having the opaque reflective coating 34 (subassembly 84) on the second surface 32 of the glass substrate 81 and a transparent reflective coating 88 on the first surface 30 to increase the reflectance of wavelengths in the wavelength range of greater than 780-1550 nm, which is the peak absorption wavelength range of the ferrous oxide (see FIG. 4). The coating 88 is a stack of three dielectric films 90-92, which includes a 90 nm thick titanium oxide film 90 provided on or over the first surface 30 of the glass substrate 81, a 90 nm thick silicon oxide film 91 provided on or over the titanium oxide film 90, and a second 90 nm thick titanium oxide film 92 provided on or over the silicon oxide film 91.

With reference to FIGS. 9 and 10 as needed, the percent reflectance of the subassembly 84 (Curve A) and of the subassembly 84 having the coating 88 (Curve C) over the wavelength range of 300-1610 nm was obtained using the proprietary software program developed by PPG Industries, Inc. discussed above. The reflectance for the wavelengths in the range of 1610-2500 shown in FIG. 10 is a linear extension of the reflectance at the wavelength 1610 nm where the calculated reflectance values for the subassembly 84 (Curve A), the coated subassembly 80 (Curve B) discussed above, and the coated subassembly 86 (Curve C) converge.

Table 3 below shows the percent reflectance for the subassembly 84 of the solar mirror 86 and the subassembly 84 having the coating 88 of the solar mirror 86. The values are based on ISO 9050 (2003) methodology with wavelength ranges of 300 to 380 nm for the ultraviolet range ("UV") greater than 380 to 780 nm for the visible range ("VIS"), greater than 780 to 2500 nm for the infrared range ("IR"), and 300 to 2500 nm for the total solar energy range ("TS") range of the electromagnetic spectrum. The reflected UV, VIS, IR and TS were calculated using ISO 9050 (2003) methodology.

TABLE 3

| | Reflectance in % | | | |
|---|---|---|---|---|
| | UV | VIS | IR | TS |
| Subassembly 84 | 59.26 | 93.84 | 70.51 | 80.60 |
| Subassembly 84 with coating 88 | 55.64 | 94.02 | 74.85 | 83.15 |

With reference to Table 3, the percent reflectance change between the subassembly 84 and the subassembly 84 having the coating 88 is a decrease of 6% in the UV; is an increase of 1% in the VIS; is an increase of 6% in the IR, and is an increase of 3% in the TS. The subassembly 84 having the coating 88 (FIG. 11) has a greater percent reflectance increase in the TS than the subassembly 84 having the coating 82 (FIG. 8) because of the percent increase of reflectance in the VIS and the IR ranges.

The embodiments of the coatings of the invention are not limited to the non-limiting embodiments of the invention discussed above to increase the total solar energy reflected by a solar mirror by increasing the percent reflectance of the wavelengths in the wavelength ranges of ferric and ferrous iron. As is appreciated, ferric and ferrous irons are colorants which impart optical properties to the glass, e.g. as disclosed in, but not limited to U.S. Patent Publication No. 2007-0243993. The invention, however, is not limited to increasing the reflectance of the wavelengths for ferric and ferrous irons, and can be used to increase the reflectance of other colorants, e.g. but not limited to cobalt oxide (CoO), selenium (Se), chromium oxide ($Cr_2O_3$), neodymium oxide ($Nd_2O_3$), titanium oxide ($TiO_2$), erbium oxide ($Er_2O_3$) and nickel oxide (NiO). Further, the invention in is not limited to the reflective coatings discussed herein, and other coating stacks of dielectric layers, e.g. as disclosed in Australian Patent No. 758267 can be used in the practice of the invention. The Australian patent in its entirety is hereby incorporated by reference.

Further the invention contemplates applying one coating to increase the reflectance of the absorbable wavelength of one colorant, e.g. the ferric iron, and a second coating to increase the reflectance of the absorbable wavelength of another colorant, e.g. ferric iron. Increasing the number of coating to increase the reflectance of solar energy can decrease the transmission of solar energy through the glass substrate to be reflected from the opaque reflective coating 34. In selecting the transparent reflective coating, the reflection and transmission of the solar energy in the different wavelength ranges for the UV, VIS and IR have to be balanced to optimize the total solar energy reflected by the solar mirror. In other words, the transparent reflective coating on the first surface of the solar mirror should increase the reflectance of the absorbable wavelengths and increase the total solar energy reflected by the solar mirror toward the converting device 25 (see FIG. 2).

As can be appreciated, the invention is not limited to the manner in which the transparent reflective coating 66 (FIG. 2, 82 (FIG. 8) and 88 (FIG. 11) is applied to the glass substrate. In the preferred practice of the invention the coating is applied to a glass ribbon as it passes through a flat glass forming chamber as discussed in U.S. Pat. No. 5,356,718, or applied to the glass ribbon as it passes from the float glass forming chamber to an annealing lehr as discussed in U.S. Pat. Nos. 4,111,150 and 4,719,126. Further, the transparent reflective coating of the invention can also be applied to the glass by the magnetron sputtering vacuum deposition coating process (also known as "MSVD"), e.g. as disclosed in U.S. Pat. No. 7,323,249. The titanium coating used in the practice of the invention is of the type disclosed in U.S. Pat. No. 7,049,022, and the dielectric coating 88 is of the type disclosed in Australian Patent. No. 758267. U.S. Pat. Nos. 4,111,150; 4,719, 126; 5,356,718; 7,049,022, and 7,323,249 in their entirety are incorporated herein by reference.

In another non-limiting embodiment of the invention, the transparent reflective coating of the invention, e.g. the titanium oxide coatings 66 and 82 are sodium ion barriers that prevent, or limit, sodium ions from leeching out of the soda-lime-silica glass. The sodium ions leeching out of the glass react with moisture in the atmosphere, which moisture converts sodium ions to sodium compounds, e.g. sodium hydroxide and sodium carbonate. The sodium compounds can etch the surface of the glass sheet and can deposit as a precipitate on the surface of the glass substrate. The sodium compound precipitates on the glass surface decrease the transmission of solar energy through the glass substrate, decreases the transmission of the solar energy reflected from the reflective coating 34 and changes the specular concave surface 30 of the shaped substrate 28 (see FIG. 2) and the specular surface 56 of the flat glass substrate 52 (see FIG. 3) to a non-specular or diffusing surface. The term "specular surface" as used herein means a light reflective surface where a light ray incident on the reflective surface has an angle of incident equal to the angle of reflection. The term "non-specular or diffusing surface" as used herein means a reflective surface where a light ray incident on the reflective surface has an angle of incident different from the angle of reflection. Titanium films having a thickness of 50 nm (500 angstroms) provide a barrier to prevent or limit sodium ions reacting with the atmosphere.

Attention is directed to U.S. patent application Ser. No. 12/709,045 filed on Feb. 19, 2010 for a more detailed discussion of sodium ions leeching out of the soda-lime-silica glass and techniques for applying, sodium ion barrier coating to prevent buckling and fracturing of the barrier coating during a glass shaping process to shape a coated flat piece of glass to a parabolic shaped piece of glass. U.S. patent application Ser. No. 12/709,045 in its entirety is hereby incorporated by reference.

As can now be appreciated, the invention is not limited to the percent reflectance of the transparent reflective coating in the wavelength range desired to be reflected. More particularly, the reflectance can be equal to or more than 10%, preferably equal to or greater than 35%, most preferably equal to or greater than 50%.

As can now be appreciated, the invention can be used with other articles to reduce the absorption of wavelengths, e.g. windows. Further, in another non-limiting embodiment of the invention, the transparent first surface mirror can also selectively reflect wavelengths of light, for example ultraviolet light, that can be harmful to the substrate, for example transparent polymeric substrates, or the layers of material deposited on the second surface of the mirror.

As can be appreciated, the invention is not limited to the embodiments of the invention discussed herein, and the scope of the invention is only limited by the scope of the following claims.

What is claimed is:

1. A solar reflecting mirror comprising:
    a solar reflecting mirror subassembly and a reflecting coating, the solar reflecting mirror subassembly comprising:
        a transparent glass substrate having a first surface and a second surface opposite to the first surface, the glass substrate having a composition comprising an ingredient that absorbs one or more wavelengths of the electromagnetic spectrum, and
        an opaque solar reflecting coating over the second surface of the glass substrate, wherein the second surface of the glass substrate is between the first surface of the substrate and the opaque solar reflecting coating, and solar energy incident on the first surface of the substrate has a first percent reflection of solar enemy from the solar reflecting mirror subassembly; and
    the transparent reflecting coating over the first surface of the substrate, the transparent reflecting coating reflecting one or more of the wavelengths of the electromagnetic spectrum such that solar energy incident on the transparent reflecting coating over the first surface of the substrate has a second percent of reflection of solar energy, wherein the second percent of reflection of the solar energy is greater than the first percent of reflection of the solar energy, wherein the first surface of the glass substrate is between the second surface of the glass substrate and the transparent reflecting coating.

2. The solar reflecting mirror according to claim 1, wherein the one or more wavelengths of the electromagnetic spectrum absorbed by the glass substrate are in the range of 300-400 nanometers.

3. The solar reflecting mirror according to claim 1, wherein the ingredient of the glass substrate that absorbs one or more wavelengths of the electromagnetic spectrum is ferric iron.

4. The solar reflecting mirror according to claim 3, wherein the transparent reflecting coating over the concave surface of the glass substrate is a titanium oxide film.

5. The solar reflecting mirror according to claim 4 wherein the titanium oxide film has a thickness in the range of 25-125 nanometers.

6. The solar reflecting mirror according to claim 5 wherein the titanium oxide film has a thickness of 25 nanometers.

7. The solar reflecting mirror according to claim 5 wherein the titanium oxide film has a thickness of 90 nanometers.

8. The solar reflecting mirror according to claim 1, wherein the one or more wavelengths of the electromagnetic spectrum absorbed by the glass substrate are in the wavelength range of 780-1550 nanometers.

9. The solar reflecting mirror of claim 1 wherein the first surface of the solar reflecting mirror subassembly is a concave surface; and the second surface of the solar reflecting mirror subassembly is a convex surface.

10. The solar reflecting mirror according to claim 9, wherein the ingredient that absorbs one or more wavelengths of the electromagnetic spectrum is ferrous iron.

11. The solar reflecting mirror according to claim 10, wherein the transparent reflecting coating is a dielectric coating stack.

12. The solar reflecting mirror according to claim 11 wherein the dielectric coating stack comprises a first titanium oxide film on the first surface of the glass substrate, a silicon oxide film over the first titanium oxide film and a second titanium oxide film over the silicon oxide film.

13. The solar reflecting mirror according to claim 9, wherein the one or more wavelengths of the electromagnetic spectrum are in the range of 300-400 nanometers and in the range of 780 to 1550 nanometers.

14. The solar reflecting mirror according to claim 13, wherein the ingredient that absorbs one or more wavelengths of the electromagnetic spectrum in the wavelength range of 300-400 nanometers is ferric iron; the ingredient that absorbs one or more wavelengths of the electromagnetic spectrum in the wavelength range of 780-1550 nanometers is ferrous iron, and the transparent reflecting coating is a dielectric coating stack.

15. The solar reflecting mirror according to claim 14 wherein the dielectric coating stack comprises a first titanium oxide film on the first surface of the glass substrate, a silicon oxide film over the first titanium oxide film and a second titanium oxide film over the silicon oxide film.

16. The solar reflecting mirror of claim 1, wherein the glass is a soda-lime-silica glass; the second percent of reflection of the solar energy is at least 2.0% greater than the first percent of reflection of the solar energy, wherein the wavelength range of the electromagnetic spectrum is 300-2500 nanometers.

17. The solar reflecting mirror according to claim 16 wherein the ingredient that absorbs one or more wavelengths of the electromagnetic spectrum is a colorant that provides the glass substrate with optical properties.

18. In a solar reflecting mirror having a transparent glass substrate having a first surface designated to face a source of solar energy and a second surface opposite to the first surface, the second surface designated to face away from the source of solar energy, wherein the transparent glass substrate has a composition comprising an ingredient that absorbs one or more wavelengths of the electromagnetic spectrum defined as absorbable wavelengths, wherein the ingredient that absorbs one or more wavelengths of the electromagnetic spectrum is ferrous iron, and the absorbable wavelengths are in the wavelength range of 780-1550 nanometers, and an opaque solar reflecting coating on the second surface of the transparent glass substrate, the improvement comprising:

a transparent reflecting dielectric coating stack over the first surface of the substrate to increase the percent reflection of one or more of the absorbable wavelengths of the electromagnetic spectrum in a direction away from the first and the second surface of the transparent substrate, wherein the dielectric coating stack comprises a first titanium oxide film on the first surface of the glass substrate, a silicon oxide film over the first titanium oxide film and a second titanium oxide film over the silicon oxide film, wherein the first and second titanium oxide films and the silicon oxide film each have a thickness in the range of 80-100 nanometers.

19. The solar reflecting mirror according to claim 18 wherein the silicon oxide film is on the first titanium oxide film, the second titanium oxide film is on the silicon oxide film, and the first and the second titanium oxide film and the silicon oxide film each have a thickness of 90 nanometers.

* * * * *